United States Patent [19]

Kelley et al.

[11] Patent Number: 5,277,753
[45] Date of Patent: Jan. 11, 1994

[54] CONTINUOUS PLASMA SURFACE TREATMENT METHOD FOR ELONGATED, FLEXIBLE, CLEAR POLYMERIC TUBING

[75] Inventors: James Kelley, St. Paul; Paul Rudolph, Minneapolis; Gordon R. Helmer, Blaine; Daniel E. Haeg, Anoka; Roger C. Erickson, Ham Lake, all of Minn.

[73] Assignee: Medtronic, Inc., Minneapolis, Minn.

[21] Appl. No.: 985,430

[22] Filed: Dec. 4, 1992

Related U.S. Application Data

[62] Division of Ser. No. 785,857, Oct. 31, 1991, Pat. No. 5,198,033.

[51] Int. Cl.$^5$ .............................................. B44C 1/22
[52] U.S. Cl. ................................. 156/643; 242/75.51
[58] Field of Search ................................ 118/723, 718; 242/75.51; 156/643

[56] References Cited

U.S. PATENT DOCUMENTS

| | | | |
|---|---|---|---|
| 2,405,662 | 8/1946 | McManus | 118/718 X |
| 3,858,820 | 1/1975 | Crouse | |
| 4,362,632 | 12/1982 | Jacob | 156/345 X |
| 4,542,711 | 9/1985 | Izu et al. | 118/718 |
| 5,016,561 | 5/1991 | Tokai et al. | 118/718 |
| 5,035,613 | 7/1991 | Breads et al. | 264/16 X |
| 5,133,422 | 7/1992 | Coury et al. | 128/784 |

OTHER PUBLICATIONS

Matsuzawa et al., "Semi-continuous plasma polymerization coating applied onto the inside surface of plastic tubing", Organic Coatings Appl. Polym. Sci. Proc., 47, 397, 1982.

Hatada et al, "The glow-discharge treatment of poly(-vinyl chloride) tube," Org. Coatings Appl. Polym. Sci. Proc., 47, 391, 1982.

Encyclopedia of Polymer Science and Engineering, vol. 15, pp. 234-235, 1989.

Encyclopedia of Chemical Technology, vol. 19, pp. 275-285, 1982.

Amsov et al., Attachment to Vacuum System for Depositing Coatings on Strip, Apr. 1981 (translation).

Gombotz et al., "Gas Discharge Techniques for Biomaterial Modification", CRC Critical Reviews in Biocompatibility, 4, pp. 1-42 (1984).

1991 Product Specification sheets for Plasma Science PS 0500 and PS 1010 Plasma Treatment Chambers.

*Primary Examiner*—Brian E. Hearn
*Assistant Examiner*—Jonathan D. Baskin
*Attorney, Agent, or Firm*—Daniel W. Latham; Harold R. Patton

[57] ABSTRACT

A plasma treatment apparatus for treating elongated clear polymeric tubing, by moving the tubing through a plasma generation chamber and maintaining tension on the tubing below that at which clarity of the tubing is reduced.

5 Claims, 4 Drawing Sheets

CONTINUOUS PLASMA SURFACE TREATMENT METHOD FOR ELONGATED, FLEXIBLE, CLEAR POLYMERIC TUBING

This is a divisional of copending application Ser. No. 07/785,857 filed on Oct. 31, 1991, now U.S. Pat. No. 5,198,033.

BACKGROUND OF THE INVENTION

Treatment of substrates, particularly polymeric substrates, with low pressure ionized gases or "plasmas", has widely been reported to produce alterations in the substrate surfaces which are desirable for certain applications. For example, plasma treatment may reduce surface contact angles, improving wettability of the surface and/or bondability with certain adhesives, and may also effect cross-linking of the substrate material. Use of certain polymerizing gases may also allow the substrates to be coated with very thin layers of polymer. Other uses for plasma treatment are described in Gombotz et al, "Gas-Discharge Techniques For Biomaterial Modification", *CRC Critical Reviews in Biocompatibility*, 4, pp. 1–42 (1984).

In co-pending application Ser. No. 07/754,326, filed Sep. 4, 1991, as a continuation of Ser. No. 07/457,019, filed Dec. 26, 1989, incorporated herein by reference, it is disclosed that silicone rubber tubing employed as a component of heart pacemaker leads has a tendency toward surface blocking. Surface blocking is a phenomena which can result in adjacent implanted leads sticking to each other instead of moving independently within the body, thereby increasing the risk of dislodgment of the leads. The referenced application discloses that plasma treatment of the silicone tubing used in forming such leads reduces blocking, rendering pacemaker leads manufactured therefrom more able to slip against each other within the body.

The present invention pertains to an apparatus which is particularly useful for treating implantable lead materials as described in Ser. No. 07/754,326, but also has application for treatment of other strip-stock material which may be desired to be plasma treated for any purpose. The term "strip-stock" as used herein is used generally to describe materials having very long lengths relative to their circumference and includes flexible pipe and tubing, wire, filaments, strands, webs, and the like.

Because of their relatively long length, strip-stock materials are generally unsuited for batch treatment processes in which the entire length of the article is treated simultaneously in a vaccum chamber containing a plasma. However, they may be located portion-wise by pushing or drawing the strip-stock material through a relatively short plasma treatment chamber within a treatment apparatus until the entire length has been treated. An apparatus for treating a roll of silicone tubing in this manner is disclosed in co-pending application Ser. No. 07/754,326. In that application, a motor driven reel and pulley system is used to draw a length of tubing from a feed reel into and through a plasma generated in a region of the apparatus and then winding the tubing up on a take-up reel as it comes out of the plasma generating region. The feed and take-up reels are located in a single evacuated vessel fed with a suitable gas, the same vessel having a pair of capacitively coupled plates to a RF source, the space between the plates serving as the plasma generating region.

An alternative construction for treatment of strip-stock is the commercially available PS1010 Plasma Treatment System, sold by Plasma Science, of Foster City, Calif.

In working with silicone tubing treated in the manner described in Ser. No. 07/754,326, it was subsequently discovered that the treatment process frequently produced reel-to-reel and place-to-place loss of clarity of the tubing material. As little as 10% of the treated length of the roll of clear silicone tubing retained its original clarity using the apparatus of Ser. No. 07/754,326. This loss of clarity created a problem in the manufacture of pacemaker leads, making it difficult to inspect the leads after assembly.

Investigations by the inventors of the present invention resulted in the discovery that the loss of clarity problem is associated with the change in the topography of the surface of the substrate after treatment, and the topography changes were attributable to differences in the tension on the tubing within the plasma treatment zone of the apparatus from time to time. This last discovery has, in turn, now lead to the development of the instant invention as described herein.

SUMMARY OF THE INVENTION

In one aspect, the disclosed invention may be defined as a plasma treatment apparatus including means for moving an elongated flexible strip-stock through a plasma gas within a plasma treatment region of the apparatus so as to effect plasma treatment of the surface of the strip-stock material, the apparatus including tension maintenance means for maintaining tension on the strip-stock within a predetermined range as the strip-stock is moved through the plasma treatment region.

A particular apparatus within the scope of the invention includes a vacuum chamber including a strip-stock storage area, a treated stock receiving area and a plasma treatment area between said storage and receiving areas; evacuation means for substantially evacuating the vacuum chamber; gas supply means for supplying a plasma generating gas to the plasma treatment region of the vacuum chamber at reduced pressure; plasma generating means for generating a plasma in the plasma treatment region of the vacuum chamber; moving means for moving an elongated flexible strip-stock from the storage area through the plasma treatment area to the receiving area; and tension maintenance means for maintaining tension on the strip-stock below a predetermined maximum as the strip-stock is moved through the plasma treatment area.

In a further aspect, the invention may be described as a process for plasma treating an elongated flexible strip-stock material comprising generating a plasma in a plasma generating chamber; moving the strip-stock through the chamber at a predetermined speed to effect plasma treatment of the surface thereof; and maintaining tension on the strip-stock within a predetermined range as the strip-stock is moved through the chamber.

The invention herein also encompasses novel treated strip-stock elastomeric polymer materials prepared by the inventive process and characterized by a substantially uniform surface topography over the entire length thereof.

DETAILED DESCRIPTION OF THE INVENTION

Figure 1:
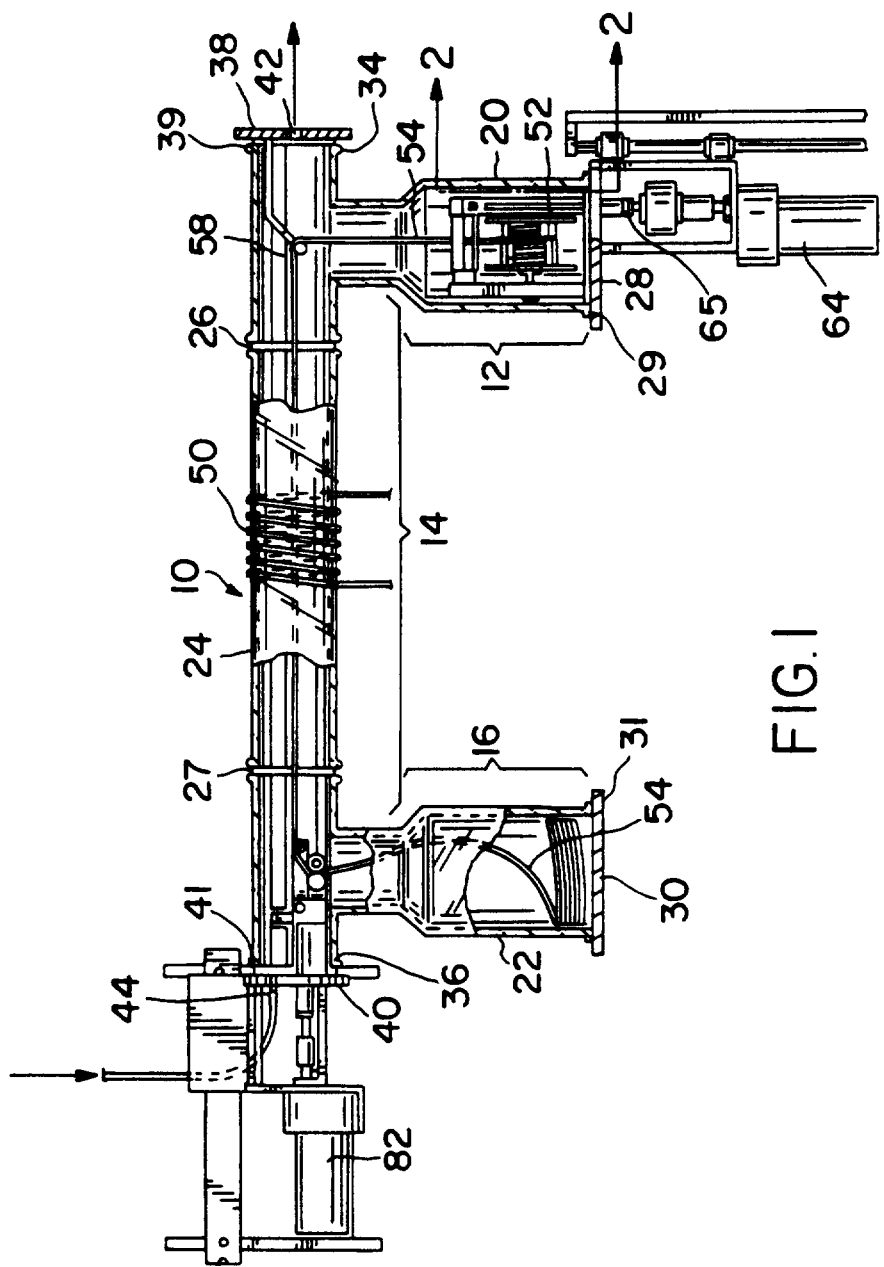
FIG. 1 is a side elevational view of the present invention with parts cut away.
Figure 2:
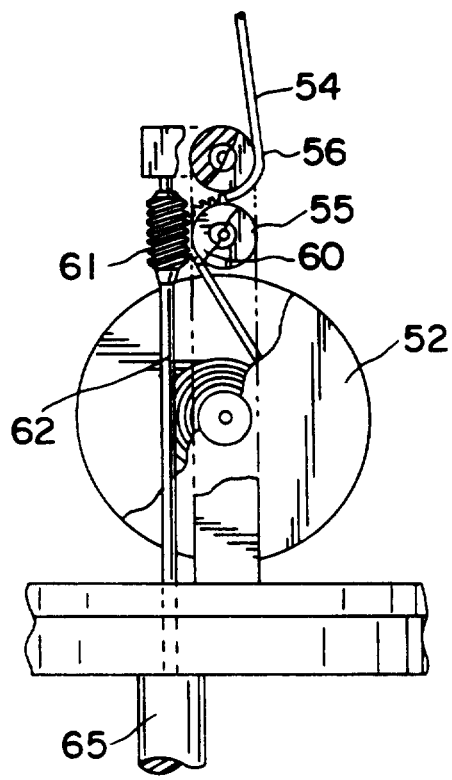
FIG. 2 is a fragmentary sectional elevational view thereof taken along line 2—2 of FIG. 1.
Figure 3:
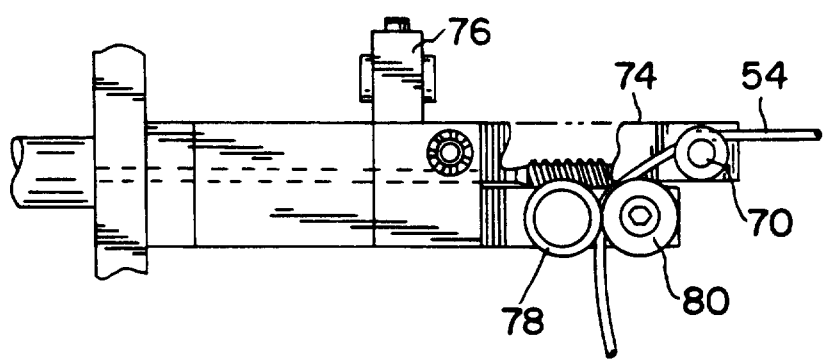
FIG. 3 is an enlarged detail of FIG. 1 with parts cut away showing the tension control mechanism of the inventive apparatus.

In FIGS. 1-3, there is shown a preferred apparatus embodying the invention hereof. The apparatus includes a vacuum chamber 10 which comprises a storage area 12, a plasma treatment region 14 and a treated stock receiving area 16. Suitably the apparatus may be constructed from a pair of tee jars 20, 22 with a linear tubular segment 24 therebetween. O-ring seals 26, 27 are respectively situated between the tee jars and the tubular segment 24. The bottoms of tee jars 20, 22 are sealed by base members 28, 30 and O-rings 29, 31, respectively.

Jar ports 34, 36 of the tee jars are closed by end caps 38, 40 and associated O-ring seals 39, 41.

Cap port 42 in end cap 38 provides connection to a vacuum source. Cap port 44 in end cap 40 provides connection to a gas plasma supply, suitably a Nitrogen source.

An externally generated induction coil 50 connected to a RF power source, not shown, provides means for generating plasma within the plasma treatment area 14.

Reel 52 rotatably mounted in the storage area of the vacuum chamber carries a roll of clear elastomeric polymer tubing 54 or other strip-stock material awaiting treatment. The tubing 54 is fed from reel 52 into the plasma treatment area via pinch rollers 55, 56 and idler roller 58 located in the proximal end of the plasma treatment region. Circular gear 60, engaged by worm gear 61 on the end of shaft 62, drives lower pinch roller 55. Shaft 62 is connected to a constant speed motor 64 outside the vacuum chamber by a sealed feed through 65 so that the tubing is fed at constant speed into the plasma treatment region.

On the distal end of the plasma generating region of the vacuum chamber is a second idler roller 70 on the end of a journaled beam 74. A load cell 76 is operatively mounted on beam 74 to detect the load applied to the beam as the tubing 54 passes over roller 70. As tension on the tubing increases, the detected load increases. Consequently, the load cell output is a signal indicative of the tension on tubing 54 within the plasma generation region.

From roller 70 the tubing passes out of the plasma into the storage area 16 between pinch rollers 78, 80. Roller 78 connects motor 82 by a feedthrough and worm gear mechanism similar to the mechanism which drives roller 55. Motor 82 has a variable speed which is controlled by a suitable computer, not shown, which responds to the force details by load cell 76 so as to maintain the tension on tubing 54 within a predetermined range.

In alternative embodiments, not shown, the pinch rollers 55 and 78 may be driven via an indirect connection, such as a belt and pulley connection which allows the roller speed to vary from a 1:1 ratio with the motor speed.

After passing between pinch rollers 78, 80 the tubing is allowed to free fall into the storage area 16 allowing the treated tubing to relax to its unstressed condition.

Figure 4:
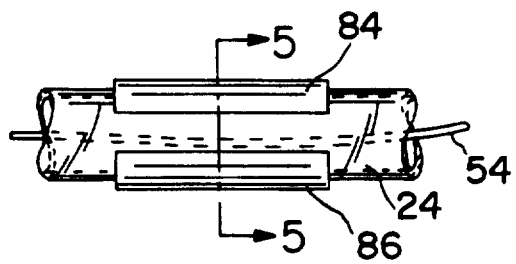
FIG. 4 is a fragmentary side elevational view of an alternate embodiment thereof employing a coupled capacitive plate RF generator.
Figure 5:
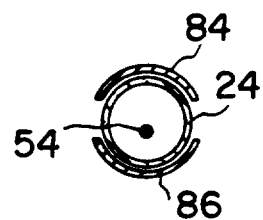
FIG. 5 is a section thereof taken along line 5—5 of FIG. 4.

FIGS. 4 and 5 depict a portion of the device of FIG. 1 employing alternative mechanism for plasma generation. In the device of these figures the induction coil surrounding the vacuum chamber has been replaced by external capacitively coupled plates 84, 86 connected to a RF source in a known manner. In still further alternatives, not shown, an inductive coil or a coupled capacitive plate assembly may be located on the inside of tubular segment 24 for plasma generation.

Figure 6:
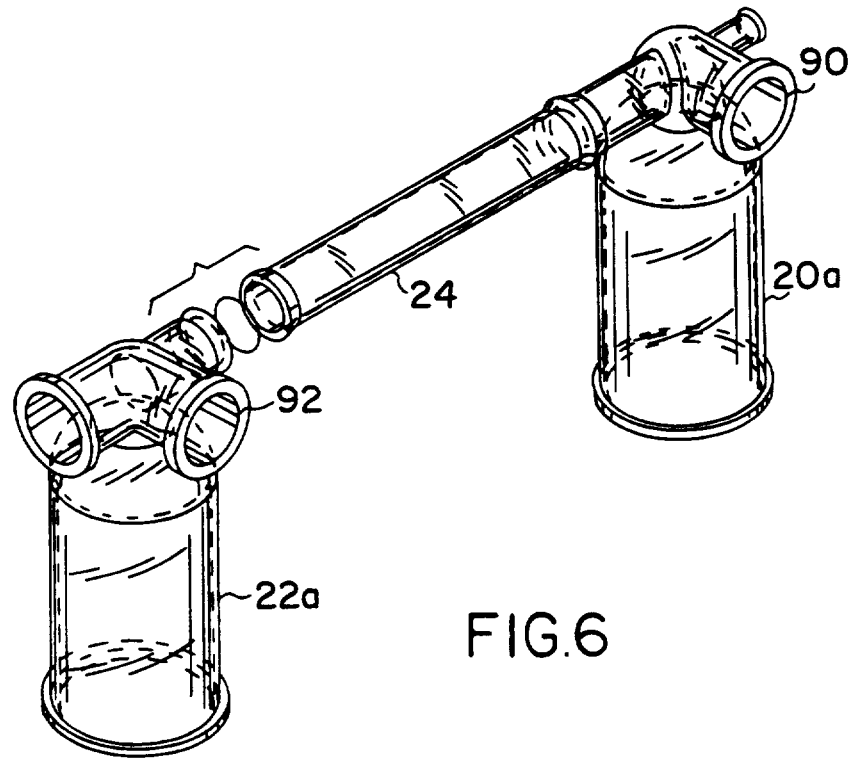
FIG. 6 is an exploded perspective view of an alternative embodiment of the vacuum chamber portion of the present invention.

FIG. 6 depicts an alternative construction for the vacuum chamber in which the tee jars 20a and 22a located on either end of a tubular segment 24 are provided with additional sealable ports 90, 92, respectively. Conveniently, the feed motor 64 feed through 65 of FIG. 1 may be relocated to port 90 in this embodiment, with a corresponding relocation of pinch rollers 55, 56, thereby providing easier removal of the base of jar 20a so as to facilitate loading of a new roll of tubing into jar 20a. Similarly, the port 92 provides easier access for threading the tubing over roller 70 of journaled beam 74 and between pinch rollers 78, 80.

The apparatus depicted in FIGS. 1-6 can generally be employed for any goods deployable from a reel. Minor modifications will be necessary to utilize other packages, such as fan-folded sheets or center pull skeins. In the former case the reel may suitably be removed and the fan-folded bundle simply placed on the base 29. In the latter case a suitable skein retainer may need to be employed.

It will be appreciated by those skilled in the art that still other structural arrangements can be made to accomplish the tension maintenance and stock moving functions without departing from the invention herein; for instance, reversing the location of the constant speed and variable speed motors, using a reel drive rather than pinch rollers, etc.

Any gas already known for glow discharge may be used as well as mixtures of such gases. These gases are generally referred to as plasma gases and can be grouped as nonpolymer forming and polymer-forming types. Typical gases used in nonpolymer forming discharges are hydrogen, helium, argon, nitrogen, ammonia, carbon dioxide and, in special cases, $C_2F_6$ which can exchange hydrogen and fluorine. Examples of polymer-forming gases are: $C_2F_4$, $C_3F_6$, $C_2H_4$, $C_2H_2$, $CH_4$, $CH_2 CHCO_2H$, $C_2H_3 CONH_2$, and amino or epoxy functional silanes.

Nitrogen, argon, helium, carbon dioxide, ammonia, oxygen, $C_2F_4$, $C_3F_6$, $C_2F_6$ and combinations thereof are preferred. Particularly preferred gases for use alone or in various mixtures are argon, oxygen, helium, nitrogen, ammonia and carbon dioxide, nitrogen being most particularly preferred.

Both nonpolymer-forming and polymer-forming plasma treatments of the surface of silicone rubber reduce surface blocking. Plasma treatment with nonpolymer-forming gas is generally preferred.

The actual tension range employed will be determined empirically since the degree of topography modification varies with polymer material and other reaction parameters, such as gas pressure, line speed of the substrate material, gas flow rate and RF power. Preferably all of the reaction parameters are monitored and controlled by known means. Suitable tension ranges can readily be determined for given conditions of these variables which provide acceptable and consistent treatment of the target substrate.

Moreover, the level of treatment sought may vary, depending upon the intended use for the substrate. For instance, in applications where the surface is being prepared for subsequent adhesive bonding the objective may be to obtain a consistent treatment which will alter the topography of the substrate, but which is insufficient to alter the dimensions, flexibility or other physical properties of the substrate material as a whole.

For a silicone rubber tubing substrate, such as Silastic ® silicone tubing, treated to improve slip, typical reaction parameters in a 1 meter-long reaction chamber, as shown in FIGS. 1-3, are as follows:

| gas: | $N_2$ |
|---|---|
| pressure: | 40 millitorrs |
| line speed: | 8.5 inches/min. |
| gas flow rate: | 4 cc/min. |
| RF power: | 103 watts |
| tension: | 80 gm/meter. |

These conditions provide optimal slip improvement (reduction of blocking) without loss of clarity. A tension of as little as about 40 gm/meter can still provide an adequate level of plasma treatment to provide anti-slip under these flow rate pressue and power conditions, but a slower line speed may be required. A tension of 100 gm/meter would produce loss of clarity under the same conditions unless line speed is increased.

Figure 7:
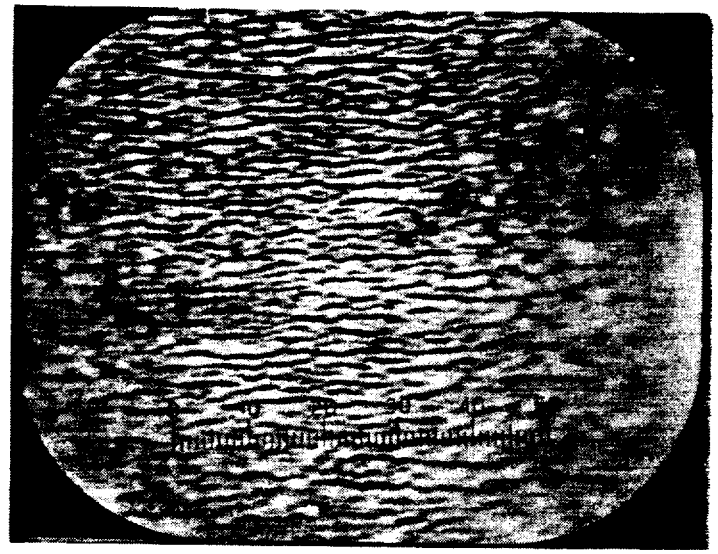
FIG. 7 is a photomicrograph of the surface of a representative portion of silicone rubber tubing treated by the prior process of Ser. No. 07/754,326.
Figure 8:
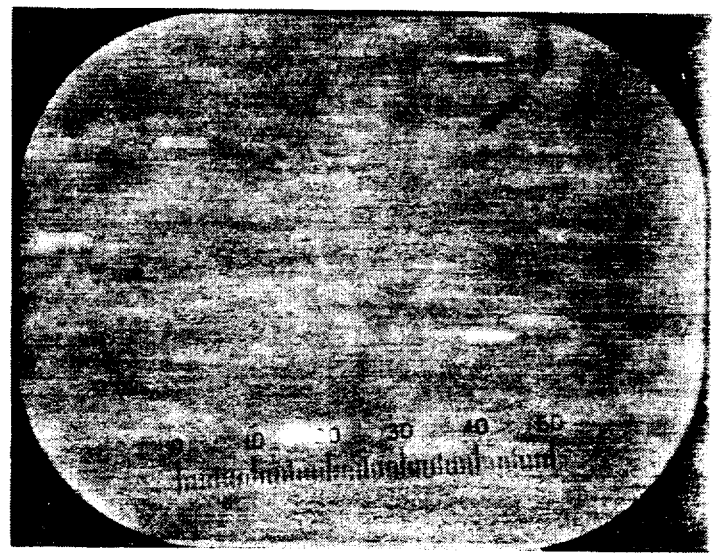
FIG. 8 is a photomicrograph of the surface of a representative portion of silicone rubber tubing treated in accordance with the inventive process of the invention.

Whereas a 100-foot roll of clear silicone rubber tubing treated as described herein, after treatment, provides substantially 100 feet of usable product with undiminished clarity and a smooth topography, as shown in FIG. 7, the process and apparatus of Ser. No. 07/754,326 provides approximately 10 feet of similarly useful product, the remaining product having a roughened surface topography, as shown in FIG. 8, which reduces the clarity of the tubing without further improving the slip of the product.

This completes the description of the preferred and alternate embodiments of the invention. Those skilled in the art may recognize other equivalents to the specific embodiment described herein which equivalents are intended to be encompassed by the claims attached hereto.

What is claimed is:

1. A process for plasma treating an elongated, flexible, clear polymeric tubing material comprising:
generating a plasma in a plasma generating chamber;
moving the polymeric tubing through the chamber at a predetermined speed to effect plasma treating of the surface thereof; maintaining tension on the tubing below a predetermined level at which the clarity of the polymeric tubing is reduced by the plasma treatment.

2. A process as in claim 1 wherein the polymeric tubing is a clear silicone elastomeric tubing material.

3. A process as in the claim 1 wherein the plasma is generated in a non-polymer forming gas selected from the group consisting of hydrogen, oxygen, helium, argon, nitrogen, ammonia, carbon dioxide and $C_2F_6$.

4. A process as in claim 1 wherein the plasma is generated in a polymer forming gas selected from the group consisting of $C_2F_4$; $C_3F_6$; $C_2H_4$; $C_2H_2$; $CH_4$; $CH_2CHCO_2H$, $C_2H_3CONH_2$, and amino or epoxy functional silanes.

5. A process as in claim 1 wherein the tension on the tubing is maintained in a predetermined range by the steps of:
measuring the tension applied to the tubing; and
adjusting the tension applied to the tubing to within the predetermined range.

* * * * *